United States Patent [19]

Abramson et al.

[11] Patent Number: 5,781,790
[45] Date of Patent: Jul. 14, 1998

[54] METHOD AND APPARATUS FOR PERFORMING FLOATING POINT TO INTEGER TRANSFERS AND VICE VERSA

[75] Inventors: Jeffrey M. Abramson, Aloha; Kris G. Konigsfeld, Portland, both of Oreg.

[73] Assignee: Intel Corporation, Santa Clara, Calif.

[21] Appl. No.: 580,751

[22] Filed: Dec. 29, 1995

[51] Int. Cl.[6] ................................................ G06F 9/30
[52] U.S. Cl. ...................... 395/800.23; 395/566; 395/393
[58] Field of Search ........................ 395/800.23, 384, 395/566, 393

[56] References Cited

U.S. PATENT DOCUMENTS

| | | |
|---|---|---|
| 5,191,649 | 3/1993 | Cadambi et al. . |
| 5,261,071 | 11/1993 | Lyon . |
| 5,280,615 | 1/1994 | Church et al. . |
| 5,291,586 | 3/1994 | Jen et al. ............................ 395/500 |
| 5,420,990 | 5/1995 | McKeen et al. . |
| 5,420,991 | 5/1995 | Konigsfeld et al. . |
| 5,467,473 | 11/1995 | Kahle et al. . |
| 5,627,983 | 5/1997 | Popescu et al. .................... 395/393 |
| 5,655,141 | 8/1997 | Ogden et al. .................. 395/800.23 |
| 5,659,782 | 8/1997 | Senter et al. ................... 395/800.23 |

OTHER PUBLICATIONS

Popescu, Val; Schultz, Merle; Spracklen, John; Gibson, Gary; Lightner, Bruce; Isaman, David, "The Metaflow Architecture", IEEE Micro, Jun. 1991, pp. 10–13 and 63–73.
Johnson, Mike; *Superscalar Microprocessor Design*; Prentice Hall, Inc., New Jersey, 1991.

*Primary Examiner*—Larry D. Donaghue
*Attorney, Agent, or Firm*—Blakely, Sokoloff, Taylor & Zafman

[57] ABSTRACT

A processor that performs integer-to-floating point transfers and vice versa using a store buffer in the processor to obviate the need for transferring data to memory and then back from memory. In this manner, these transfers may be performed to enable dedicated execution pipelines, such as integer execution pipelines and a floating point execution pipelines, to share data.

21 Claims, 3 Drawing Sheets

METHOD AND APPARATUS FOR PERFORMING FLOATING POINT TO INTEGER TRANSFERS AND VICE VERSA

FIELD OF THE INVENTION

The present invention relates to the field of computer systems; more particularly, the present invention relates to performing floating point to integer transfers and vice versa.

BACKGROUND OF THE INVENTION

A computer system may be divided into three basic blocks: a central processing unit (CPU), memory, and input/output (I/O) units. These blocks are coupled to each other by a bus. An input device, such as a keyboard, mouse, stylus, analog-to-digital converter, etc., is used to input instructions and data into the computer system via an I/O unit. These instructions and data can be stored in memory. The CPU receives the data stored in the memory and processes the data as directed by a set of instructions. The results can be stored back into memory or outputted via the I/O unit to an output device, such as a printer, cathode-ray tube (CRT) display, digital-to-analog converter, etc.

Today, many central processing units (CPUs) employ separate integer and floating point execution pipelines. Each of the separate pipelines operates as a separate data path in which integer operations are executed in the integer execution pipelines and floating point operations are executed in the floating point pipelines. One benefit to having separate execution data paths is that it provides more parallelism to occur during execution of a program in an effort to increase throughput. Although beneficial, such an architecture requires additional layers or logic and additional buses, which add to both the complexity and the cost.

Some computer systems use store buffers. Store buffers have been employed in the art on in-order execution computer systems for buffering memory store operations, thereby freeing the central processing unit (CPU) to continue to execute other instructions without having to wait for the actual completion of memory store operations. In order to avoid incorrect data being returned for memory load operations, typically the entire store buffer is checked for address conflicts for each memory load operation. If at least one address conflict is detected, the memory load operation is blocked and the entire store buffer is flushed, causing all the buffered memory store operations to be performed immediately. In the meantime, the memory load operation remains blocked and the CPU waits while the flush operation is being performed. The memory load operation is unblocked at the end of the flush operation, and the CPU resumes execution upon return of the data being loaded.

Numerous programs are designed independently of the architecture of the CPU on which they are to be run. In some programs, data resulting from execution of integer operations are often subsequently used by a floating point operation, and vice versa. In these cases, what is needed is a way of performing integer-to-floating point transfers and floating point-to-integer transfers. If separate integer and floating point execution data paths exist, performing such transfers requires a transfer between the register files associated with each datapath. In the prior art, where separate execution datapaths are used without a direct path between their separate register files, floating point-to-integer transfers (and vice versa) are performed by writing the floating point data out to memory and then loading it back into the integer execution datapath. This requires going off-chip, which is both time consuming and requires use of an external bus and cache (or other memory).

What is needed is a way to perform floating point-to-integer transfers and vice versa in a processor having decoupled integer and floating point execution datapaths without having to perform external memory cycles.

SUMMARY OF THE INVENTION

A method and apparatus for performing integer-to-floating point transfers and vice versa is described. The present invention includes a processor fabricated on an integrated circuit. The processor includes an integer execution data path, a floating point execution data path, and a memory execution unit. The memory execution unit performs transfers of data between the datapaths. The transfers are accomplished by issuing a load operation and a store operation. The load operation and the store operation are not dispatched to memory.

DETAILED DESCRIPTION OF THE PRESENT INVENTION

A method and apparatus for performing floating point to integer transfers and vice versa is described. In the following detailed description of the present invention numerous specific details are set forth, in order to provide a thorough understanding of the present invention. However, it will be apparent to one skilled in the art that the present invention may be practiced without these specific details. In other instances, well-known structures and devices are shown in block diagram form, rather than in detail, so as not to obscure the present invention.

Figure 1:
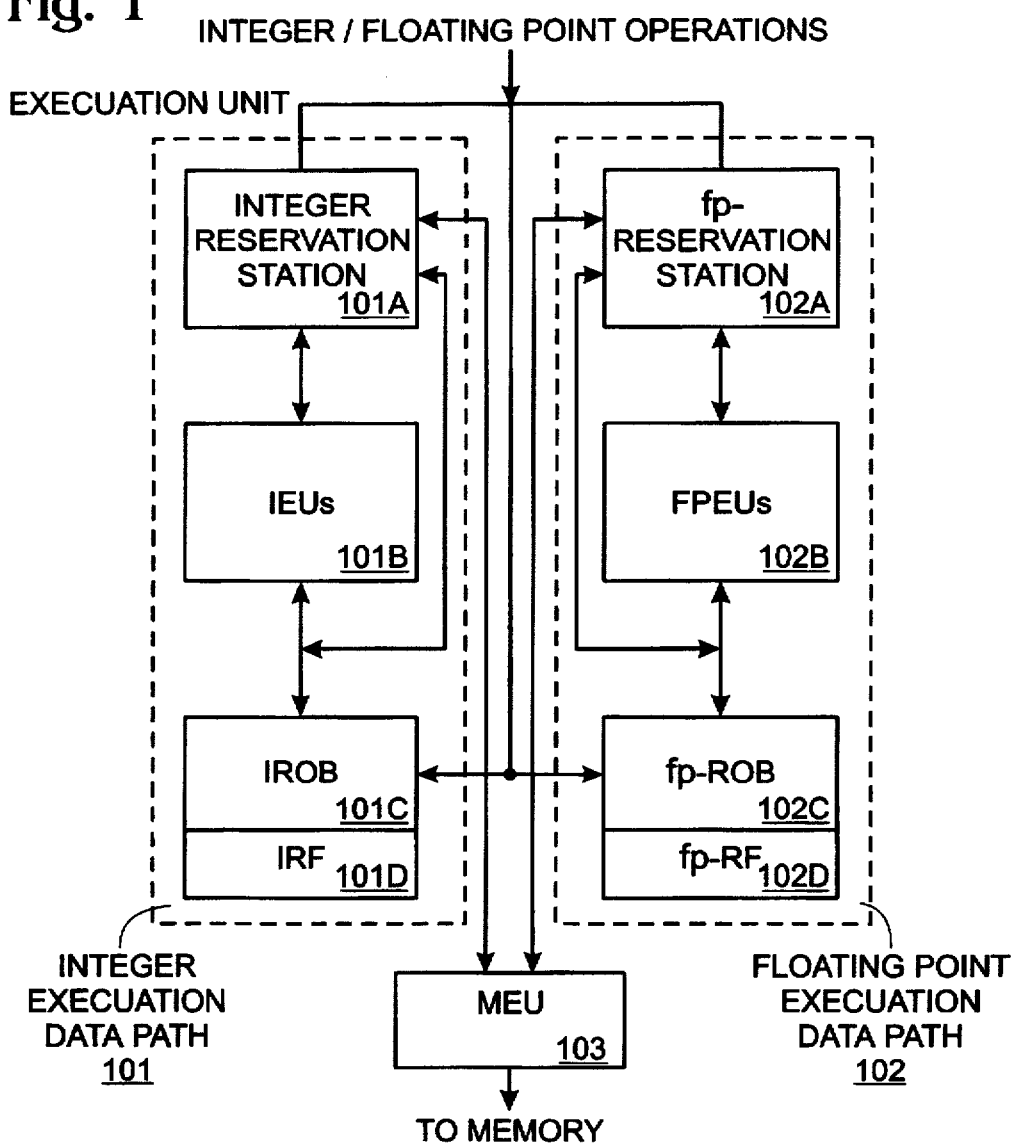
FIG. 1 is a block diagram of one embodiment of the present invention.

The present invention provides for transfers between floating point and integer datapaths through the use of a shared memory execution unit in the processor. FIG. 1 is a block diagram of the present invention. Referring to FIG. 1, selected portions of a processor are shown including an integer execution data path 101, a floating point execution data path 102, and a memory execution unit (MEU) 103. Integer execution datapath 101 executes integer generations, while floating point execution datapath 102 executes floating point operations. The integer and floating point operations are issued from a decoder/issue unit (not shown).

Each execution datapath includes a reservation station (RS), one or more execution units (EUs), a reorder buffer (ROB), and a register file. As shown, an integer RS 101A is coupled to integer EUs (IEUs) 101B and a combined integer ROB (IROB) 101C and integer RF (IRF) 101D. The IEUs 101B are also coupled to the combined IROB 101C and IRF 101D. The floating point RS 102A is coupled to floating point EUs (FPEUs) 102B and a combined 2floating point (FPROB) 102C and floating point RF (FPRF) 102D. The FPEUs 102B are also coupled to the combined FPROB 102C and RF 102D.

Each reservation station (101A, 102A) receives and stores issued operations, which includes load and store operations, resolving their operands with data from the EUs (101B, 102B), the data cache memory (not shown), and the ROB/RF (101C/101D; 102C/102D) and holding them until their operands are all resolved. Each RS then dispatches the issued instructions to the EUs and the MEU 103 as appropriate.

The MEU 103 and EUs, in turn, perform their operations accordingly. The execution results of IEUs 101B and FPEUs 102B are held in ROB 101C and ROB 102C, respectively, and then committed by IRF 101D and FPRF 102D, respectively, in the order the instructions were issued. Speculature execution results of the mispredicted branches are not committed, but instead are held in the ROBs and purged upon their detection.

The execution datapaths operate independently and are decoupled from each other. That is, there are no dedicated buses running between the two. These execution datapaths share the use of MEU 103 to interface to memory.

The memory execution unit 103 of the processor is responsible for execution and dispatch of store and load operations to memory. The memory execution unit 103 comprises a memory ordering buffer having a store buffer and a load buffer.

In one embodiment, the store buffer is a first-in-first-out (FIFO) structure for storing address, size, data, and other key attributes. The top pointer of the structure points to the store most recently retired. The bottom of the store buffer (i.e., the one containing the oldest retired store) is the one ready to be written to a memory subsystem, such as a data cache memory. The store buffer is only visible to the processor core (e.g., an execution unit and instruction fetch and issue unit).

The load buffer is a scratchpad buffer used by the memory subsystem to impose access ordering on memory loads. Each load operation is tagged with the Store Buffer ID (SBID) of the store previous to it. This SBID represents the relative location of the load operation compared to all stores in the execution sequence. When a load operation executes in the memory, its SBID is used as a beginning point for analyzing the load operation against all older store operations in the buffer.

The memory execution unit 103 performs the transfers of the present invention using store forwarding. Store forwarding operates as a bypass where data that is to be stored in memory is forwarded to a load operation. In one embodiment, store forwarding is only used if the data, size of the integer and floating point data are the same or the size of the floating point data is less than the integer. In other words, store forwarding can occur if the access length of the load operation is a subset of that of the store.

The memory execution unit 103 of the present invention is capable of performing such transfers by executing a store operation followed by a load operation, similar to that of the prior art, except that the store operation never dispatches to memory and the load operation is one that must receive data that is forwarded from a store operation. Furthermore, the data transfer sizes of both the load and the store are the same size because they are issued as an instruction pair as discussed below.

The present invention uses two instructions to facilitate the transfers. These instructions are:

F2Ixfer address

I2Fxfer address

When either is received by a decoder/issue unit in the processor, each of these instructions is decoded into a "fake" store operation(s) and a "fake" load operation. The address chosen for both operations is the same. In one embodiment, the address is zero. Note that the decoder/issue unit has the address (es) that is used by the transfer instructions.

In one embodiment, the fake store operation comprises two separate operations, a store address operation (STA) that calculates the address for the store and a store data (STD) operation that generates the data that is to be stored. Both of these will be discussed in greater detail below. Both of the STA and STD operations are issued to an RS which dispatches the operations to MEU 103 for execution. In the present invention, these store operations are written into the store buffer with a tag (e.g., bit(s), identifier, etc.) indicating that this store is not to dispatch to memory and another tag indicating that this store must remain in the store buffer until forwarded (i.e., a tag indicating whether the store has forward or not).

In one embodiment, the load operation has an address argument that is meaningless (i.e., it is a "don't care"). The load operation, however, does have a SBID (i.e., a store color) associated with it and it must forward from the store in the store buffer with the same SBID. This is because the load operation and store operation(s) are issued in pairs. Once the load operation receives the forwarded data, the data is written back for the use by the execution datapath and a tag is placed in the store buffer to indicate that the data has been forwarded.

In one embodiment, a memory order buffer (MOB) in the memory execution unit 103 tracks the states and activities of the store and load operation pair to ensure that the transfer occurs. The MOB also retires the store operation and the load operation, as well as removes them from the memory execution unit, after forwarding has been completed. The MOB identifies those operations that may be returned, in part, by determining whether the store data has been forward. The MOB makes the determination by examining tag in the store buffer.

Note that if the processor of the present invention uses separate integer and floating point reorder buffers (ROBs), the load operation may be dispatched to its datapath prior to the store operation. If this occurs, in the present invention the load operation will block because there is an unknown address in front of it (the address of the store). The blocking of local operations to ensure memory ordering and consistency is well-known in the art.

Therefore, the present invention uses a share memory order buffer to perform data transfers between integer and floating point execution datapaths which are decoupled and, thus, do not share common register files. Because of the separate register files, there are three requirements to perform such transfers using the store/load pairs of the present invention. First, the load operation must follow the store in execution. Second, the execution of the store must not destroy memory. Lastly, the store must not leave the store buffer until forwarded.

The Processor of the Present Invention

Figure 2:
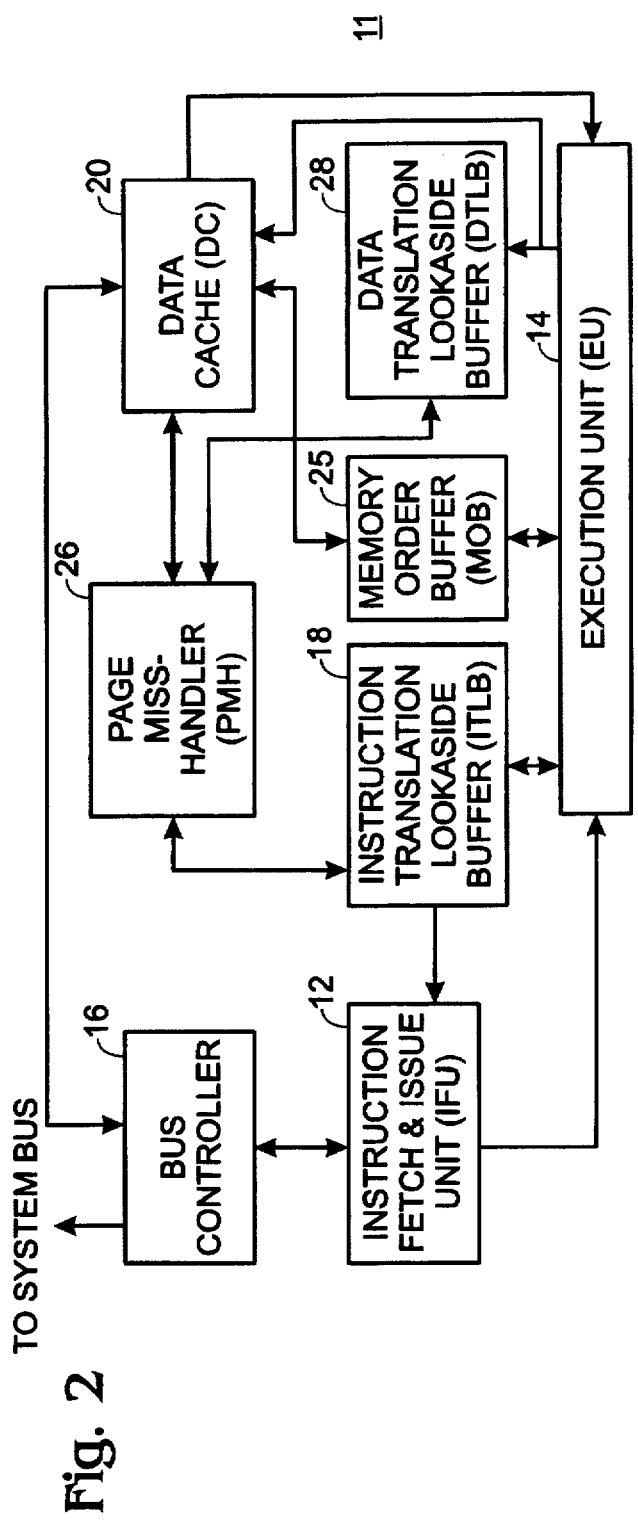
FIG. 2 illustrates the relevant portions of one embodiment of the processor unit of FIG. 1 in further detail.

Referring now to FIG. 2, a block diagram illustrating the one embodiment of the processor of the present invention as shown. As illustrated, the processor 11 comprises an instruction fetch and issue unit (IFU) 12, an execution unit (EU) 14, a bus controller 16, an instruction and a data translation lookaside buffer (ITLB and DTLB) 18 and 28, a page miss handler (PMH) 26, a memory order buffer (MOB) and a data cache (DC) 20. The IFU 12 includes an instruction cache (not shown). The elements 12–28 are coupled to each other as illustrated. Together they cooperate to fetch, issue, execute, and save execution results of instructions in a pipelined manner.

The IFU 12 fetches instructions from the memory unit 22 through the bus controller 16 and the system bus 24, stores them in the instruction cache, and issues them in order to the execution unit 14 for execution. Some instructions are fetched and issued speculatively. In the present invention, when IFU 12 encounters a transfer instruction, it decodes it into a store and a load. The EU 14 executes the instructions as soon as their operand dependencies on execution results of preceding instructions are resolved, including those instructions that are speculatively fetched and issued. In other words, the instructions are not necessarily executed in the order they were issued, and some instructions are speculatively executed. However, the execution results are retired or committed in order, and speculative execution results of mis-predicted branches are purged.

Data loads and stores are dispatched from the EU 14 to the MOB 25 and DC 20. Some data loads and stores are dispatched speculatively. Data loads are dispatched as a single operation, whereas data stores are dispatched as two operations, a store data operation (STD) and a store address operation (STA). As will be described in further detail below, data loads are buffered in a load buffer (LB) in the MOB 25, whereas the data stores are buffered in a store data buffer (SDB) of the EU 14, a store address buffer (SAB) of the MOB 25, and a physical address buffer (PAB) of the DC 20. The retirement circuitry of the EU 14 promotes the buffered data loads and stores to processor or retirement ready states in due course, and then retires or commits the data loads and stores in order. The data stores may be promoted to speculatively executed states before being promoted to processor or retirement ready states. The data cache 20 responds to the data loads, regardless of whether or not the data loads are speculative. Additionally, the MOB 25 forwards store data for the data loads if appropriate.

Both the instruction cache of the IFU 12 and the data cache are physically addressed. The ITLB 18 and the DTLB 28, among other functions, are used to translate the accessing linear addresses that are currently cached into physical addresses through table lookups, and provide memory types for the physical addresses. The PMH 26 is used to handle page misses in both the instruction cache of the IFU 12, and the data cache 20, which includes among other functions, translation of page missed linear addresses into physical addresses, determination of memory types for the page missed physical addresses, and causing the allocation and filling of cache lines.

The IFU 12 is intended to represent a broad category of instruction fetching and issuing elements found in many computer systems. Its function and constitution are well known and will not be further described. The EU 14 is also intended to represent a broad category of execution units found in many computer systems.

The ITLB 18, DTLB 28, and the PMH 26 are also intended to represent a broad category of these elements found in many computer systems.

The bus controller 16 and the data cache are also intended to represent a broad category of these elements found in most computer systems. Their functions and constitutions are well known and will not be further described.

The MOB 25, in particular, the teachings of the present invention for forwarding appropriate ones of the buffered store data to the data loads will be described in further detail below.

Figure 3:
FIG. 3 illustrates the physical address buffer (PAB) of the data cache (DC), the store data buffer (SDB) of the execution unit (EU), and the store address buffer (SAB) of the memory order buffer (MOB) of FIG. 2.

Referring now to FIG. 3, a block diagram illustrating the SDB of the EU 14, the SAB of the MOB 25, and the PAB of the DC is shown. The SDB 30, the SAB 32, and the PAB 34, all comprise equal number of buffer slots, 12 buffer slots for the illustrated embodiment. Each buffer slot is identified by a store buffer identifier (SBID). The buffer slots are allocated in order from top to bottom and then wraps around in a circular manner after reaching the bottom buffer slot. A wraparound bit is set/reset each time the allocation wraps around. A head pointer (SAB head_ext) comprising a SBID and a wraparound bit value, and a tail pointer (SAB tail_ext) comprising also a SBID and a wraparound bit value, are used to track the youngest and the oldest entries in these buffers. The head pointer is updated whenever a buffer slot is allocated for a store operation. Similarly, the tail pointer is updated whenever an allocated buffer slot is deallocated.

The STD and STA operations of each store operation are allocated a set of corresponding buffer slots of the SDB 30, the SAB 32, and the PAB 34, and identified by the SBID of the allocated set of corresponding buffer slots. The STD operation, including the store data, is stored in its allocated buffer slot in the SDB 30. The STA operation, including the opcode and the linear address (LA[31:0]), is stored in a corresponding buffer slot in the SAB 32. Additionally, a number of control and state bits, including a valid bit (v), a STA execution state bit (Ae), a store byte mask, a STD execution state bit (De), a forward only (Fo) bit and a forward complete (Fe) bit are stored in the buffer slot in the SAB 32. Lastly, the 28 high order bits of the physical address (PA[35:12]) of the STA operation are stored in a corresponding buffer slot in the PAB 34.

The v-bit indicates whether the particular SAB entry is valid. The Ae-bit and the De-bit indicate whether the respective STA or STD operation has been promoted to at least a speculatively executed state, i.e. speculatively executed or retirement ready. The size of a store operation is inferred from the opcode. The store byte mask provides for byte access checking of store operations to load operations. The Fo-bit indicates to the memory order buffer that the store is not to be dispatched to memory, while the Fc-bit indicates that the data has been forwarded.

The STD and STA operations of most store operations are promoted to the processor or retirement ready state in due course. The store data of retirement ready STD and STA operations are then written into the data cache in the "background", when the data cache is free, and then purged from the SDB 30, the SAB 32, and the PAB 34. The STD and STA operations of some of the store operations, such as those storing data to memory locations mapped to I/O devices, are not eligible to be promoted to the processor or retirement ready state. The STD and STA operations of these store operations are retired/committed, and purged from the SDB 30, the SAB 32, and the PAB 34 concurrently with their executions, e.g. when the target I/O devices are ready to accept the data being "stored". In this embodiment, the linear addresses are driven from the SAB 54 to the DTLB 28 again, and the newly generated PA is directly provided to the tag array of the data cache 20, bypassing the PAB 34 of the data cache 20.

While the present invention is being described with a store operation being dispatched as a STD and a STA operation, and the store operands are buffered in separate buffers disposed in different components of the system, based on the descriptions to follow, it will be appreciated that the present invention may be practiced with the store operation being dispatched as one or more operations, and with the store operands being buffered in one or more buffers.

Figure 4:
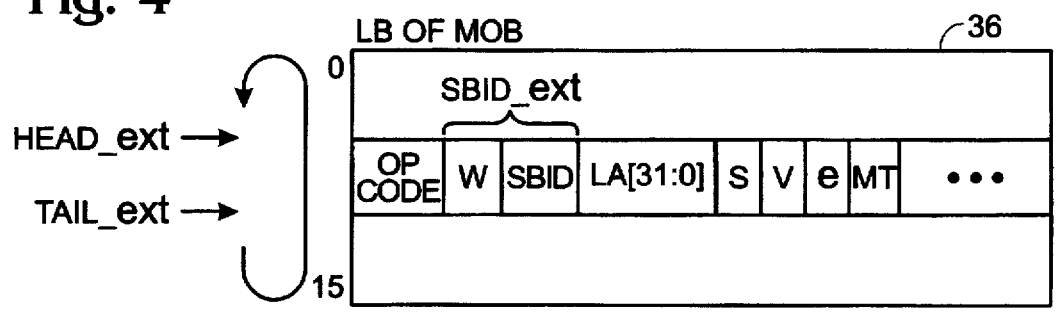
FIG. 4 illustrates the load buffer (LB) of the MOB of FIG. 2.

Referring now to FIG. 4, a block diagram illustrating the load buffer of the MOB 25 is shown. The LB 36 of the MOB 25 contains a number of buffer slots, 16 buffer slots for the illustrated embodiment. Each buffer slot is identified by a load buffer identifier (LBID). The buffer slots are allocated in order from top to bottom and then wraps around in a circular manner after reaching the bottom buffer slot. A wraparound bit is set/reset each time the allocation wraps around. A head pointer (LB head_ext) comprising a LBID and a wraparound bit value, and a tail pointer (LB tail_ext) comprising also a LBID and a wraparound bit value, are used to track the youngest and the oldest entries in these buffers. The head pointer is updated whenever a buffer slot is allocated for a load operation. Similarly, the tail pointer is updated whenever an allocated buffer slot is deallocated.

Each load operation is allocated a buffer slot of the LB 36 of the MOB 25, and identified by the LBID of the allocated buffer slot. A buffered load operation, including its opcode, wrap bit (w), store buffer identifier (SBID), linear address (LA[31:0]), and memory type (MT), is stored in its allocated buffer slot of the LB 36. Additionally, the buffered load operation also includes a number of control bits, including a valid bit (v), and an execution state (e) bit. The w-bit and the SBID indicate the wrap around state and the youngest buffered STA of the SAB 32 at the time the buffer slot of the LB 36 is assigned. The SBID combined with the w-bit is also referred as the extended SBID (SBID_ext). The SBID_ext is used to identify which buffered STAs are older than the load operation. Alternatively, it will be appreciated the relative age of the load and buffered STA operations may be determined in a variety of other manners including but not limited to time stamping the various load and STA operations. Similar to a buffered store operation, the size of a load operation is inferred from the opcode. The MT identifies the memory type of the source memory locations. The v-bit indicates whether the particular LB entry is valid. The e-bit indicates whether the particular load operation has been promoted to at least a speculatively executed state. Lastly, the load operations are promoted to processor or retirement ready states in due course, after the return of the data being loaded. The retirement ready load operations are then retired in order, and purged from the LB 36.

Figure 5:
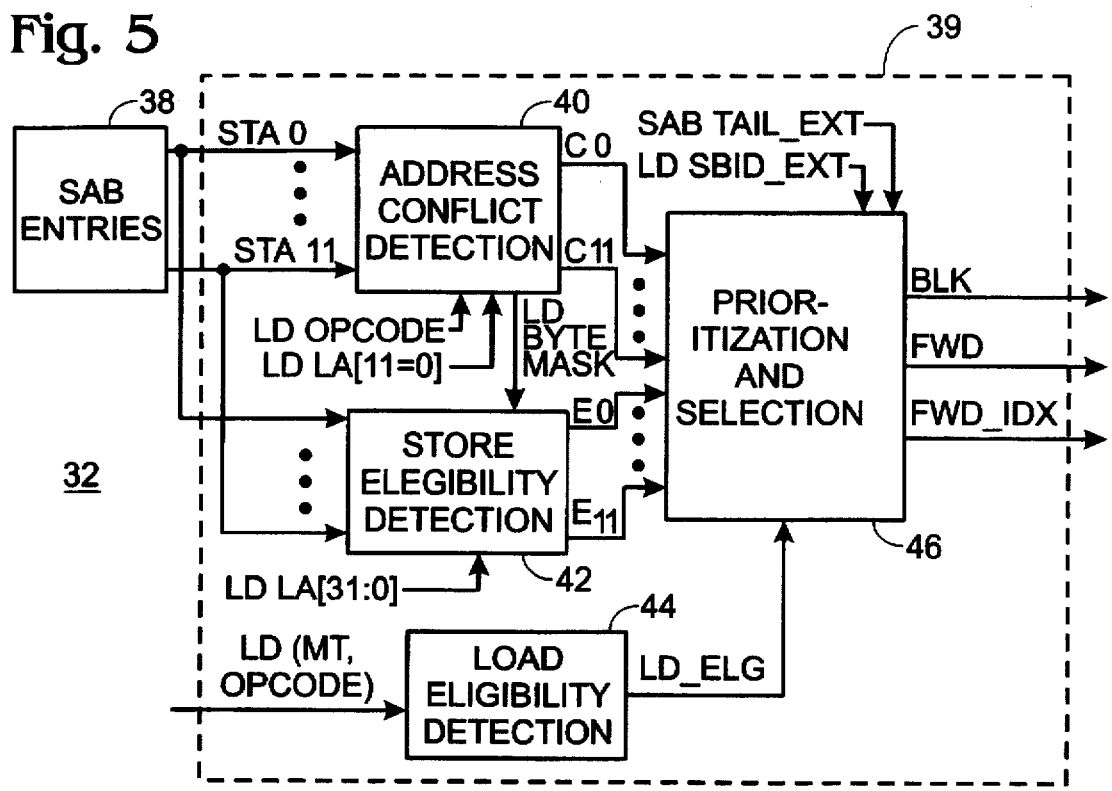
FIG. 5 illustrates the relevant portions of the SAB of FIG. 3 in further detail.

Referring now to FIG. 5, a block diagram illustrating the relevant portions of one embodiment of the SAB 32 in further detail is shown. As illustrated, in addition to the buffer slots 38, the SAB 32 further comprises store forwarding circuitry 39 that conditionally forwards store data for a load operation from a variable subset of the buffered store operations that is functionally dependent on the time the load operation is issued, taking into account the execution states of these buffered store operations. In the present invention, stores and loads issued in pairs in response to a transfer instruction are issued together and dependent on each other. Other load operations may be issued speculatively, and/or executed out-of-order. The execution states of the buffered store operations may be speculatively executed or committed.

In the embodiment illustrated, the store forwarding circuitry 39 comprises address conflict detection circuitry 40, store eligibility detection circuitry 42, load eligibility detection circuitry 44, and prioritization and selection circuitry 46. One embodiment of the store forwarding circuitry is described in U.S. patent application Ser. No. 08/176,111, entitled "Store Forwarding", filed Dec. 30, 1993, assigned to the corporate assignee of the present invention and incorporated herein by reference.

The address conflict detection circuitry 40 identifies all address conflicts between the load and buffered store operations, using the untranslated portions of the virtual addresses. The store eligibility detection circuitry 42 determines whether the store data of the buffered store operations are eligible 2to be forwarded, taking into account their execution states. Additionally, the store eligibility detection circuitry 42 takes into account a number of application dependent factors, such as address alignment, access length alignment, store data split, and store type. The load eligibility detection circuitry 44 determines whether the load operation is eligible to be forwarded store data, taking into account a number of application dependent factors, such as memory type, load data split, and load type. The prioritization and selection circuitry 46 prioritizes and blocks the load operation, based on the conflict detection results. Additionally, the prioritization and selection circuitry 46 selects and forwards one of the store data within the variable subset if any for the blocked load operation, based on the prioritization results, the store, and the load eligibility detection results.

The address conflict detection circuitry 40 receives the STA operations, a load operation's LA[11:0], and the load operation's opcode as inputs. As discussed above, the address conflict detection circuitry determines if there is an address conflict between a load and buffered stores. The address conflict detection circuitry 40 also determines that the byte mask of the store operation 1and load operation overlap. In the present invention, the byte mask for the "fake" load and the "fake" store are given the same byte mask when they are issued. Therefore, they overlap. In response, the address conflict detection circuitry 40 generates a number of conflict signals c0–c11 as outputs for the prioritization and selection circuitry 46. Additionally, in one embodiment, the address conflict detection circuitry 40 also generates a load byte mask for the load operation. In the present invention, the address conflict detection circuitry 40 will not indicate any conflict between the "fake" load and "fake" store, thereby allowing forwarding to occur.

The store eligibility detection circuitry 42 receives the STA operations, a load operation's LA[31:0], and the load operation's byte mask as inputs. As described earlier, the store eligibility detection circuitry 42 determines whether the store data of the buffered store operations are eligible to be forwarded, taking into account their execution states, and a number of application dependent factors. In this case of the present invention, the store eligibility detection circuitry 42 determines that the store data associated with the transfer is eligible for forwarding. In response, the store eligibility detection circuitry 42 generates a number of eligibility signals e0–e11 as outputs for the prioritization and selection circuitry 46. In case of the "fake" store, its eligibility signal e indicates that it is eligible to have its data forwarded.

The load eligibility detection circuitry 44 receives a load operation's opcode, and MT as inputs. In response, the load eligibility detection circuitry 44 generates a load eligibility signal LD_ELG as outputs for the prioritization and selection circuitry 46. For the "fake" load of the instruction pair, the LD_ELg signal always indicates that the load is eligible for forwarding. In one embodiment, this is indicated by the LD_ELg signal being high.

The prioritization and selection circuitry 46 receives c0–c11, e0–e11, LD_ELG, a load operation's SBID_ext, and the SAB's Tail_ext as inputs. In response, the prioritization and selection circuitry 46 generates a block signal (BLK) denoting the load operation is to be blocked if at least one address conflict is detected within the subset of buffered store operations. The BLK signal is provided to the LB 36, causing the load operation to be blocked. Additionally, the prioritization and selection circuitry 46 generates a store forward signal (FWD) and a store forward index (FWD_IDX) identifying the store data if any within the subset to be forwarded as outputs. The FWD signal is provided to the LB 36 and the FWD_IDX is provided to the SDB 30, causing the store data of the indexed STD entry in the SDB 30 to be forwarded to the blocked load operation.

In the case of the instruction pair of the present invention, the inputs provided to prioritization and selection circuitry 46 cause it to indicate that the "fake" store may be forwarded to the "fake" load. After forwarding, a bit in the load buffer indicates that it has completed.

While the present invention is being described with store forwarding circuitry 39 disposed inside the SAB 32, based on the descriptions to follow, it will be appreciated that the present invention may be practiced with the store forwarding circuitry 39 disposed inside or outside the SAB 32. Additionally, while the present invention is being described with an embodiment of the store forwarding circuitry 39 that performs the load and store eligibility detections separately and before the prioritization and selection are made, it will be appreciated that alternatively the store forwarding circuitry 39 may perform the load and store eligibility detection together and/or after the prioritization and selection. Performing the eligibility detection after prioritization and selection will require less hardware, however based on the descriptions to follow, it will be appreciated that the approach is slower. Nevertheless, it may be the "preferred" approach, if the decrease in performance is acceptable, and savings in die space is more important. Furthermore, while the present invention is being described with the store eligibility detection circuitry 42 receiving the load byte mask from the address conflict detection circuitry 40, based on the descriptions to follow, it will be appreciated that the present invention may be practiced with the address conflict detection circuitry 40 receiving the load byte mask from the store eligibility detection circuitry 42. Alternatively, each of the circuitry 40 and 42 may also individually compute the load byte mask or receive the load byte mask from an external source.

Overview of the Computer System of the Present Invention

Figure 6:
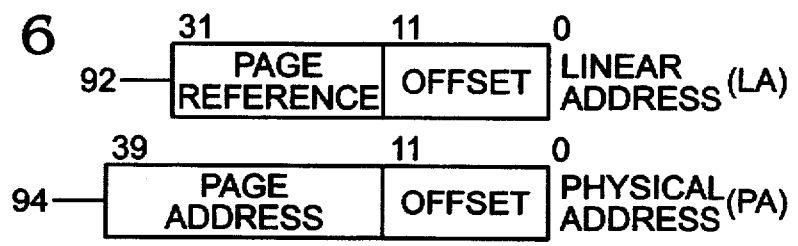
FIG. 6 illustrates one embodiment of linear and physical addresses used by the exemplary computer system of FIG. 7.
Figure 7:
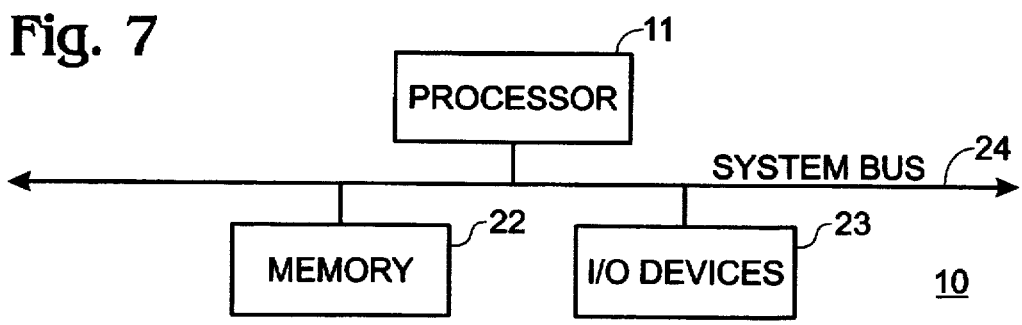
FIG. 7 illustrates an exemplary computer system incorporating the teachings of the present invention.

Referring now to FIG. 7, a block diagram illustrating an exemplary computer system incorporating the teachings of the present invention is shown. The exemplary computer system 10 comprises a processor 11, a memory unit 22, a number of I/O devices 23, and a system bus 24, coupled to each other as shown. The processor 11 is disposed on a single silicon based chip. The exemplary computer system 10 supports virtual address spaces comprising memory locations of the memory unit 22 and the addresses of the I/O devices 23, which are partitioned into memory pages and organized into memory segments. During program execution, the processor 11 buffers store operations and forwards buffered store data to load operations if appropriate. The processor 11 references memory space locations using linear addresses, which in turn get translated into physical addresses. The processor 11 computes a linear address using a base address, a displacement value, a scale value, an index value, and a segment value. A linear address is 32 bits long with the higher order bits, which get translated, identifying a memory page, and the 12 lower order bits, which do not get translated, identifying the offset into the memory page (see ref. 92 of FIG. 6). A physical address is 40 bits long with the 28 higher order bits being the translated portion of the linear address locating the memory page, and the 12 lower order bits being the untranslated portion locating the offset into the memory page (see ref. 94 of FIG. 6).

Except for the teachings of the present invention incorporated in the processor 11, the elements 11, 23–24, are intended to represent a broad category of processors, memory units, I/O devices, and system buses found on many computer systems. Their basic functions and constitutions are well known, thus will not be otherwise further described.

While for ease of understanding, the present invention is being described with the exemplary computer system 10, based on the description to follow, it will be appreciated that the present invention may be practiced on other computer systems configured in other manners, and/or having different addressing mechanisms. The functions of the processor 11 may be disposed on one or more chips, fabricated using silicon or other equivalent semiconductor materials.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

Thus, a method and apparatus for performing floating point to integer transfers and vice versa has been described.

We claim:

1. A processor fabricated on an integrated circuit, said processor comprising:

an integer execution data path;

a floating point execution data path; and a memory execution unit coupled to the integer execution data path and to the floating point execution data path, said memory execution unit performing integer-to-floating point transfers and floating point-to-integer transfers between the integer and floating point execution data paths, wherein the memory execution unit executes a load operation and a store operation to accomplish the transforms without dispatching the load operation and the store operation to memory.

2. The processor defined in claim 1 wherein the memory execution unit performs the transfers by executing a store operation and a load operation.

3. The processor defined in claim 2 wherein data associated with the store operation is forwarded to satisfy execution of the load operation.

4. The processor defined in claim 3 wherein data is forwarded based on a matching identifier associated with both the store operation and the load operation.

5. A processor fabricated on an integrated circuit comprising:

an integer execution data path;

a floating point execution data path; and a memory execution unit coupled to the integer execution data path and to the floating point execution data path, said memory execution unit performing integer-to-floating point transfers and floating point-to-integer transfers between the integer and floating point execution data paths, wherein the memory execution unit performs the transfers by executing a store operation and a load operation and data associated with the store operation is forwarded to satisfy execution of the load operation based on a matching identifier associated with both the store operation and the load operation, and further wherein the store operation and the load operation are not dispatched to memory.

6. A processor fabricated on an integrated circuit comprising:

an integer execution data path;

a floating point execution data path;

a memory execution unit coupled to the integer execution data path and to the floating point execution data path, the memory execution unit performing integer-to-floating point transfers and floating point-to-integer transfers between the integer execution data path and the floating point execution data path; and a decoder coupled to the integer and floating point execution datapaths, wherein the decoder generates a store operation and a load operation in response to a transfer instruction, said store operation corresponding to a source for the transfer instruction and said load operation corresponding to a destination for the transfer instruction.

7. The processor defined in claim 5 wherein the store operation and the load operation comprises an integer store operation and a floating point load operation, respectively, for an integer-to-floating point transfer, and wherein the store operation and the load operation comprise a floating point store operation and an integer load operation, respectively, for a floating point-to-integer transfer.

8. A processor fabricated on an integrated circuit comprising:

an integer execution data path;

a floating point execution data path; and a memory execution unit coupled to the integer and floating point execution data paths, said memory execution unit performing integer-to-floating point transfers and floating point-to-integer transfers between the integer execution data path and the floating point execution data paths, wherein the memory execution unit performs the transfers by executing a store operation and a load operation and data associated with the store operation is forwarded to satisfy execution of the load operation based on a matching identifier associated with both the store operation and the load operation, and further wherein the memory execution unit further comprises a store buffer that stores data of the store operation and forward the data to satisfy execution of the load operation.

9. The processor defined in claim 8 wherein the store buffer maintains an indication designating that the store operation is not to be dispatched to memory.

10. The processor defined in claim 8 wherein the store buffer maintains an indication representing whether data associated with the store operation has been forwarded.

11. A processor fabricated on an integrated circuit, said processor comprising:

an integer execution means for executing integer operations;

a floating point execution means for executing floating point operations; and a memory operation execution means coupled to the integer execution means and to the floating point execution means, said memory operation execution means performing integer-to-floating point transfers and floating point-to-integer transfers between the integer execution means and the floating point execution means, wherein the memory operation execution means executes a load operation to accomplish the transfers without dispatching the load operation and the store operation to memory.

12. The processor defined in claim 11 wherein the memory operation execution means performs the transfers by executing a store operation and a load operation.

13. The processor defined in claim 12 wherein data associated with the store operation is forwarded to satisfy execution of the load operation.

14. The processor defined in claim 13 wherein data is forwarded based on a matching identifies associated with both the store operation and the load operation.

15. A processor fabricated on an integrated circuit, comprising:

an integer execution means for executing integer operations;

a floating point execution means for executing floating point operations; and a memory operation execution means coupled to the integer execution means and to the floating point execution means, said memory operation execution means performing integer-to-floating point transfers and floating point-to-integer transfers between the integer execution means and the floating point execution means, wherein the memory operation execution means performs the transfers by executing a store operation and a load operation and data associated with the store operation is forwarded to satisfy execution of the load operation based on matching identifiers associated with both the store operation and the load operation, and further wherein the store operation and load operation are not dispatched to memory.

16. A processor fabricated on an integrated circuit comprising an integer execution means for executing integer operations;

a floating point execution means for executing floating point operations;

a memory operation execution means coupled to the integer execution means and to the floating point execution means, said memory operation execution means performing integer-to-floating point transfers and floating point-to-integer transfers between the integer execution means and the floating point execution means; and a decoding means for decoding a transfer instruction into a store operation and a load operation, said store operation corresponding to a source for the transfer instruction and said load operation corresponding to a destination for the transfer instruction.

17. The processor defined in claim 16 wherein the store operation and the load operation comprises an integer store operation and a floating point load operation, respectively, for an integer-to-floating point transfer, and wherein the store operation and the load operation comprise a floating point store operation and an integer load operation, respectively, for a floating point-to-integer transfer.

18. A processor fabricated on an integrated circuit comprising:

an integer execution means for executing integer operations;

a floating point execution means for executing floating point operations; and a memory operation execution means coupled to the integer execution means and to the floating point execution means, said memory operation execution means performing integer-to-floating point transfers and floating point-to-integer transfers between the integer execution means and the floating point execution means, wherein the memory operation execution means performs the transfers by executing a store operation and a load operation and data associated with the store operation is forwarded to satisfy execution of the load operation based on matching identifiers associated with both the store operation and the load operation, and further wherein the memory operation execution means further comprises a store buffer for storing data for the store operation and forward the data to satisfy execution of the load operation.

19. The processor defined in claim 18 wherein the store buffer means maintains an indication designating that the store operation is not to be dispatched to memory.

20. The processor defined in claim 18 wherein the store buffer means maintains an indication representing whether data associated with the store operation has been forwarded.

21. A method of transferring data between integer and floating point execution datapaths, said method comprising the steps of:

issuing a store operation and a load operation in response to a transfer instruction; and forwarding data associated with the store operation to the load operation without dispatching the store operation and the load operation to memory.

* * * * *

UNITED STATES PATENT AND TRADEMARK OFFICE
CERTIFICATE OF CORRECTION

PATENT NO. : 5,781,790
DATED : July 14, 1998
INVENTOR(S) : Abramson et al.

It is certified that error appears in the above-identified patent and that said Letters Patent is hereby corrected as shown below:

In column 3 at line 3 delete "2floating" and insert --floating--

Signed and Sealed this

First Day of December, 1998

BRUCE LEHMAN

Attest:

Attesting Officer

Commissioner of Patents and Trademarks